United States Patent
Fleury et al.

(10) Patent No.: US 10,630,093 B2
(45) Date of Patent: Apr. 21, 2020

(54) METHOD FOR OPTIMISING THE ARCHITECTURE OF THE POWER SUPPLY OF A LOAD

(71) Applicants: AIRBUS GROUP SAS, Paris (FR); AIRBUS DEFENCE AND SPACE SAS, Les Mureaux (FR)

(72) Inventors: Benoit Fleury, Suresnes (FR); Gregor Massiot, Toulouse (FR); Pierre-Bertrand Lancelevee, Aix-en-Provence (FR); Julien Labbe, Levallois-Perret (FR)

(73) Assignees: AIRBUS GROUP SAS, Blagnac (FR); AIRBUS DEFENCE AND SPACE SAS, Les Mureaux (FR); AIRBUS HELICOPTERS, Marignane (FR)

( * ) Notice: Subject to any disclaimer, the term of this patent is extended or adjusted under 35 U.S.C. 154(b) by 512 days.

(21) Appl. No.: 15/025,993

(22) PCT Filed: Sep. 30, 2014

(86) PCT No.: PCT/EP2014/070871
§ 371 (c)(1),
(2) Date: Mar. 30, 2016

(87) PCT Pub. No.: WO2015/044439
PCT Pub. Date: Apr. 2, 2015

(65) Prior Publication Data
US 2016/0248267 A1    Aug. 25, 2016

(30) Foreign Application Priority Data
Sep. 30, 2013  (FR) .................... 13 59451

(51) Int. Cl.
*H02J 4/00* (2006.01)
*H02J 7/00* (2006.01)
(Continued)

(52) U.S. Cl.
CPC ........ *H02J 7/0042* (2013.01); *G06F 17/5009* (2013.01); *H02J 4/00* (2013.01);
(Continued)

(58) Field of Classification Search
CPC ..... H01M 8/04089; H02M 3/158; B25F 5/00; B60K 6/28; H02J 7/34
See application file for complete search history.

(56) References Cited

U.S. PATENT DOCUMENTS

| 8,752,392 B2 | 6/2014 | Gazzino et al. |
| 2004/0126635 A1* | 7/2004 | Pearson ............ H01M 8/04089 |
| | | 429/430 |

(Continued)

FOREIGN PATENT DOCUMENTS

| DE | 10 2010 024235 A1 | 12/2011 |
| FR | 2 947 006 A1 | 12/2010 |

OTHER PUBLICATIONS

International Search Report, dated Feb. 3, 2015, from corresponding PCT application.

*Primary Examiner* — Kandasamy Thangavelu
(74) *Attorney, Agent, or Firm* — Young & Thompson

(57) ABSTRACT

A method for optimizing the architecture of the power supply of a load, includes the following steps: determination of a mission profile (16) sizing according to the power required by the load over time; definition of the sources of energy storage for hybridization; association of a characteristic behavior model with each source of energy storage; determination of the couples of sources of energy storage that can generate the mission profile with a minimum mass; and determination, from the potential couples of sources of energy storage, of the couple with the weakest mass.

14 Claims, 2 Drawing Sheets

(51) Int. Cl.
  *G06F 17/50* (2006.01)
  *H02J 7/34* (2006.01)
(52) U.S. Cl.
  CPC ........ *H02J 7/0063* (2013.01); *B64D 2221/00* (2013.01); *H02J 7/345* (2013.01)

(56) References Cited

U.S. PATENT DOCUMENTS

| | | | |
|---|---|---|---|
| 2004/0140139 A1* | 7/2004 | Malik | B60K 6/28 180/65.285 |
| 2013/0089761 A1 | 4/2013 | Schiemann et al. | |
| 2013/0213677 A1* | 8/2013 | Zhamu | B25F 5/00 173/1 |
| 2014/0175886 A1* | 6/2014 | Kwok | H02J 7/34 307/46 |
| 2014/0265605 A1* | 9/2014 | Ishigaki | H02M 3/158 307/80 |

* cited by examiner

METHOD FOR OPTIMISING THE ARCHITECTURE OF THE POWER SUPPLY OF A LOAD

FIELD OF THE INVENTION

The present invention relates to a method for optimizing the architecture of an electric power supply of a load. More specifically, the invention relates to electric power supplies comprising a plurality of energy storage sources, also known by the term "hybrid power supply".

A "hybrid power supply" is understood as a power supply comprising a plurality of energy storage sources, such as a battery associated with a pack of super-capacitors, or a battery associated with a fuel cell.

The invention has applications in many fields, and may be used in aircraft, satellites or space vehicles.

PRIOR ART

There are a number of known devices which use a hybrid power supply for the supply of a load. These devices are specifically present in electric buses and trams, or in electric or hybrid cars. These devices employ complementary energy storage sources, such as a battery and a pack of super-capacitors. The prior art specifically includes patent No. FR 2947006, which describes this type of device.

The use of a plurality of energy storage sources permits the use of one energy storage source as a make-up source at times of high load demand. This make-up source is recharged subsequently by the primary source when load demand is lower than the production capacities of the primary source.

These hybrid power supplies thus permit the restriction of the requisite capacity of the primary energy storage source and the restriction of the overall bulk of the power supply. However, for a given electric power supply, it is not always relevant to prefer to use a complex multi-source architecture over the retention of a simple solution with a single power source, for example a battery. There is therefore a risk of developing a new electric power supply architecture based upon a hybrid power supply which might prove to be more cumbersome and less effective than the previous architecture.

DESCRIPTION OF THE INVENTION

The present invention is intended to resolve this problem by proposing a method allowing this risk to be anticipated.

To this end, according to a first aspect, the invention relates to a method for optimizing the architecture of an electric power supply of a load, comprising the following steps: determination of a dimensioning mission profile according to the capacity demand of the load over time, definition of possible energy storage sources for hybridization, association of a characteristic behavior model with each energy storage source, determination of couples of energy storage sources which are capable of generating the mission profile with minimum mass, and determination, among the potential couples of energy storage sources, of the couple with the lowest mass.

The invention thus permits the identification, with a limited number of variables, of a couple of energy storage sources which deliver an optimum performance.

The invention permits the restriction of the applications of the second energy storage source in relation to the first energy storage source. Moreover, a capacity utilization profile of the second energy storage source permits the anticipation of phases for the recharging of the second energy storage source by the first energy storage source, where load requirements are lower than the production capacity of the first energy storage source.

According to one mode of embodiment, each characteristic behavior model corresponds to a Ragone diagram giving the total energy which can be supplied by the energy storage source, according to the capacity delivered per unit of mass of the energy storage source. This mode of embodiment permits the simple acquisition of characteristic behavior models, as Ragone diagrams are generally supplied by energy storage source producers.

According to one mode of embodiment, the step for determining couples of energy storage sources which are capable of generating the mission profile with minimum mass comprises the following sub-step: for each possible couple of energy storage sources for hybridization, determination of working points on the Ragone diagram for energy storage sources which are capable of generating the mission profile and minimizing the total mass of the two energy storage sources. This mode of embodiment permits the identification of the working point of each energy storage source, and also of the mass of each energy storage source associated with the working point of the Ragone diagram.

According to one mode of embodiment, the method also comprises a step for the comparison of the mass of the couple thus determined with the mass of an energy source in an existing architecture. This mode of embodiment permits the anticipation of the expected benefit in terms of mass, thereby allowing it to be decided whether or not it is appropriate to modify the existing architecture.

According to one mode of embodiment, the method comprises the following steps: definition of suitable power converters for hybridization, determination of couples of energy storage sources which are capable of generating the mission profile with minimum mass, as a function of available power converters, and determination of power converters as a function of the couple thus determined. This mode of embodiment permits the integration of a list of available power converters in the optimization of the electric power supply architecture.

According to one mode of embodiment, the step for the definition of suitable energy storage sources for hybridization involves the proposal of energy storage sources of the battery, super-capacitor or fuel cell type. This mode of embodiment permits the preselection of energy storage sources which are particularly suited to hybridization. A battery is preferably used as a primary source and a pack of super-capacitors is used as a make-up source.

According to one mode of embodiment, the method also comprises a step for the read-out of the energy storage sources in the couple thus determined, and the capacity utilization profiles of the energy storage sources in the couple thus determined.

According to a second aspect, the invention relates to architecture of an electric power supply of a load which is optimized by a method according to the invention.

BRIEF DESCRIPTION OF THE DRAWINGS

The invention is clarified by the description, provided hereinafter for explanatory purposes only, of modes of embodiment of the invention, with reference to the figures, in which.

DETAILED DESCRIPTION OF MODES OF EMBODIMENT OF THE INVENTION

Figure 1:
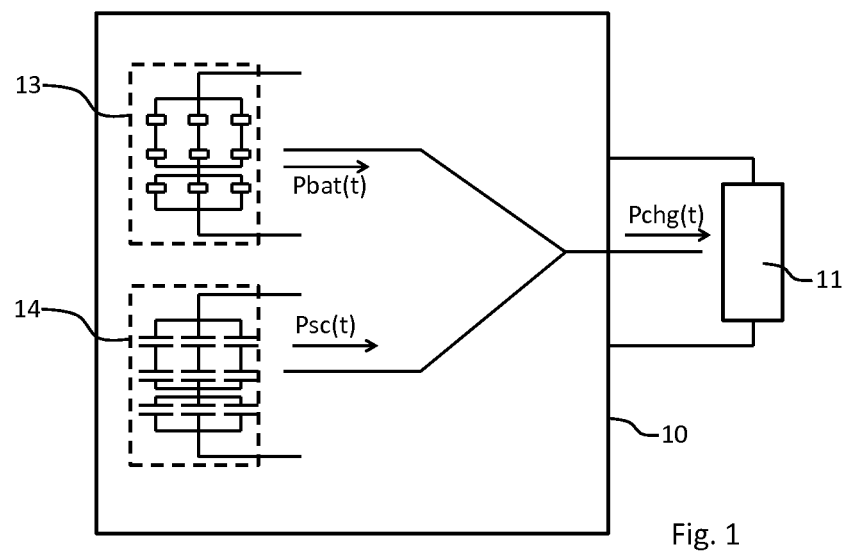
FIG. 1 shows a schematic representation of an architecture for the supply of electric power to a load.

FIG. 1 illustrates an architecture 10 for the supply of electric power to a load 11. The capacity demand Pchg(t) of the load 11 are fulfilled over time by two energy storage sources 13, 14. The first energy storage source 13 corresponds to a series of batteries delivering a capacity Pbat(t) and the second energy storage source 14 corresponds to a series of super-capacitors delivering a capacity Psc(t). As a variant, these energy storage sources may be varied without altering the invention. The load 11 corresponds to any actuator, such as a servo-controlled jack.

Figure 2:
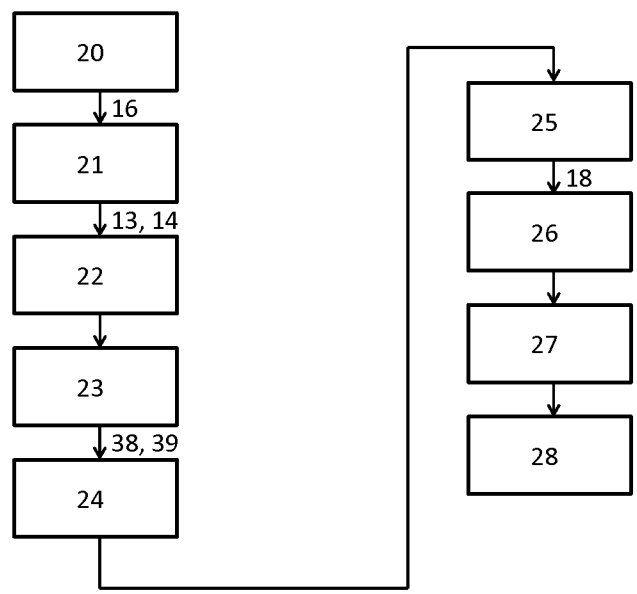
FIG. 2 shows a flowchart illustrating the method for optimizing an electric power supply architecture according to the invention.
Figure 3:
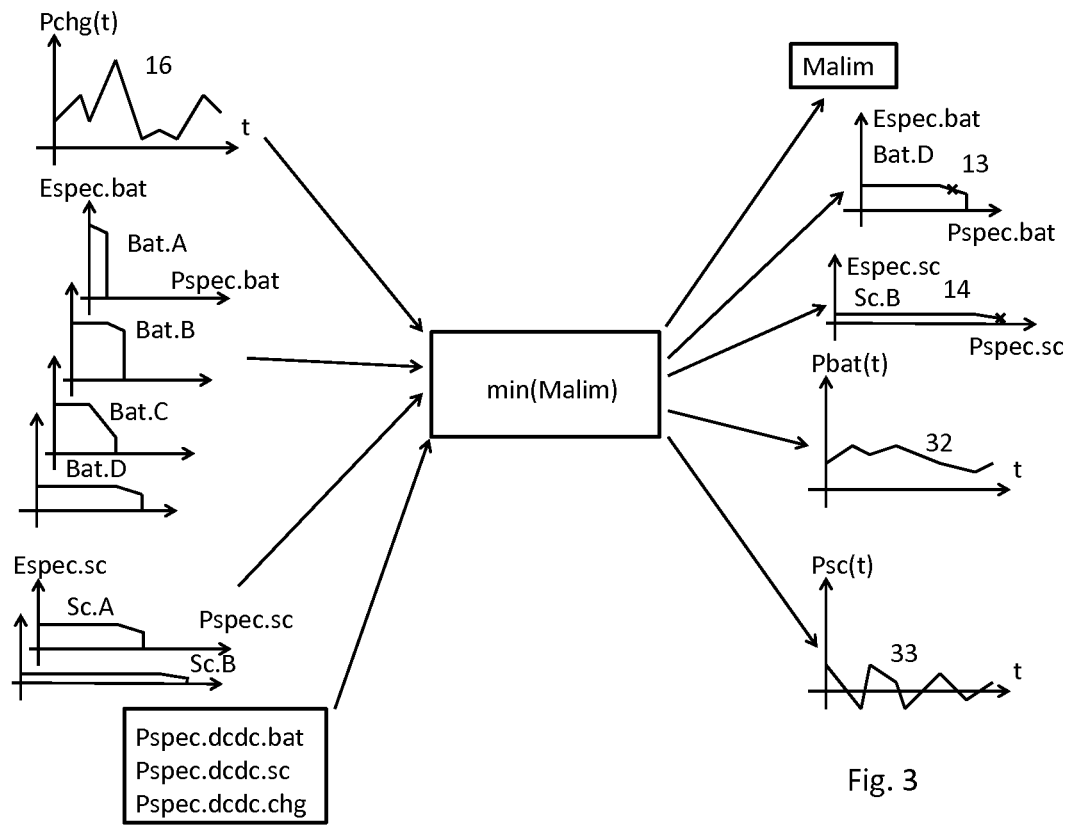
FIG. 3 shows a schematic representation of inputs and outputs in the method of the invention.

This architecture 10 is optimized by the optimization method described in FIG. 2. In a first step, the method determines, in a step 20, a dimensioning mission profile 16 according to the capacity demand Pchg(t) of the load over time t. An example of this mission profile 16 is shown in FIG. 3. In practice, this mission profile 16 is determined by a number of test series for the capacity demand Pchg(t) of the load 11 over time t. The least favorable moments in the measurements recorded are linked and sampled to generate the mission profile 16. Discretization of the sample permits the variation of the precision of the mission profile 16.

Energy storage sources 13, 14 which are suitable for hybridization are then defined, in a step 21, and each source is associated, in a step 22, with a characteristic behavior model, for example a Ragone model. A Ragone model gives the total energy which can be delivered Espec.bat, Espec.sc by the energy storage source 13, 14, according to the capacity delivered Pspec.bat, Pspec.sc per unit of mass of the energy storage source 13, 14. FIG. 3 illustrates four Ragone models for batteries Bat.A, Bat.B, Bat.c and Bat.D, and two Ragone models for packs of super-capacitors Sc.A and Sc.B. These Ragone diagrams are generally supplied by the manufacturer. Energy storage sources 13, 14 which are suitable for hybridization are preferably of the battery, super-capacitor or fuel cell type.

From the energy storage sources 13, 14 thus defined 21, the method determines, in a step 24, couples which are suitable for hybridization and are capable of generating the mission profile 16 with minimum mass. For each couple of energy storage sources 13, 14 which are suitable for hybridization, and for each working point on the Ragone diagram for energy storage sources 13, 14, the method generates a programming problem, which it resolves in order to determine the utilization profile of the energy storage sources 13, 14 which minimizes the mass of the hybrid power supply.

A couple 18 is determined from the potential couples, in a step 25, by identifying the couple with the lowest mass. In the example shown in FIG. 3, the energy storage sources 13, 14 are the battery Bat.D and the pack of super-capacitors Sc.b. The working points are represented by crosses. The method also comprises a step for the comparison 26 of the mass Malim of the couple 18 thus determined with the mass of an energy source in an existing architecture. The working points permit the definition of the utilization profiles 32, for the energy storage sources 13, 14 which are capable of delivering the mission profile. Minor variations are imposed upon the utilization profile 32 of the first energy storage source 13, whereas the utilization profile 33 of the second energy storage source 14 shows larger variations. Accordingly, the first energy storage source 13 is a primary energy source, whereas the second energy storage source 14 is a make-up energy source which is used to offset major variations in the capacity demand Pchg(t) of the load 11.

In addition to the selection of energy storage sources 13, 14, the method of the invention permits the integration of a list of power converters 38, 39 which are suitable for hybridization. One step 23 involves the definition of these power converters 38, 39, and couples of energy storage sources 13, 14 are determined, in a step 24, as a function of said power converters 38, 39. In the example shown in FIG. 3, a number of specific capacities are entered for the converters Pspec.dcdc.bat, Pspec.dc dc.sc and Pspec.dcdc-.chg. The power converters 38, 39 are determined, in a step 27, as a function of the couple 18 selected.

One step 28 involves the read-out of the energy storage sources 13, 14 in the couple 18 thus determined, and the capacity utilization profiles 32, 33 of the energy storage sources 13, 14 in the couple thus determined 18.

Figure 4:
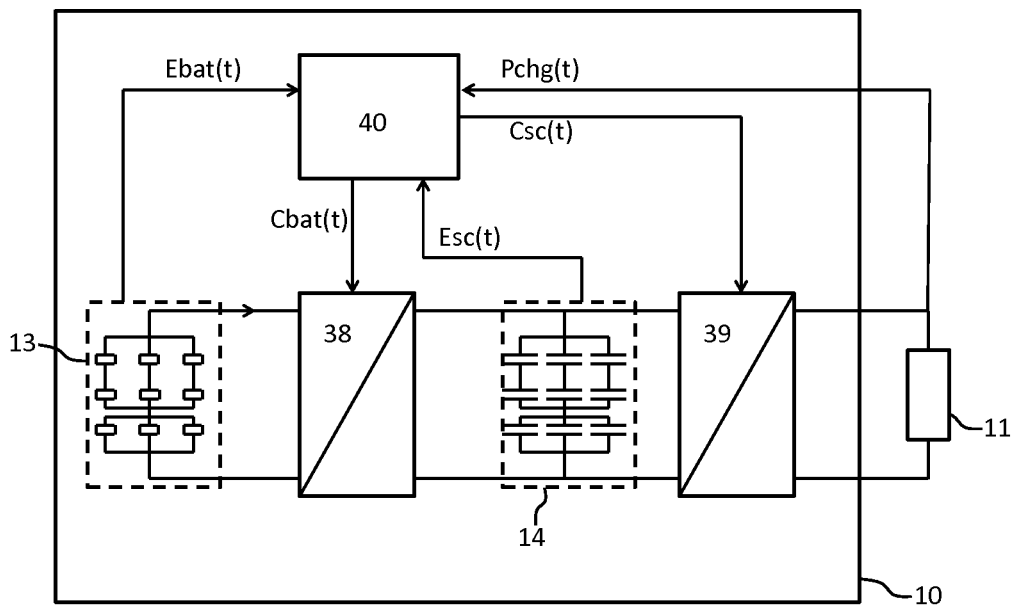
FIG. 4 illustrates an optimum electric power supply architecture.

The invention thus permits the definition of an optimized architecture 10 of an electric power supply of a load 11. FIG. 4 represents an optimized architecture 10 of an electric power supply of a load 11. A computing unit 40 controls two converters 38, 39 which are designed to define a capacity Pbat(t) and Psc(t) delivered by the energy storage elements 13, 14 via two control means Cbat(t) and Csc(t). The control means Cbat(t) and Csc(t) are adjusted over time t as a function of the capacity demand Pchg(t) of the load 11 and the utilization profiles 32, 33 of the energy storage sources 13, 14.

The invention claimed is:

1. A method for optimizing the architecture of an electric power supply of a load, comprising:
    determining a dimensioning mission profile according to a capacity demand over time of a load;
    defining possible energy storage sources for hybridization, among energy storage sources of the battery, super-capacitor or fuel cell type;
    associating a characteristic behavior model with each energy storage source;
    determining couples of energy storage sources which are capable of generating a mission profile with minimum mass;
    determining, among potential couples of energy storage sources, a couple with the lowest mass; and
    constructing an electric power supply of a load using said couple with the lowest mass.

2. The method as claimed in claim 1, wherein each characteristic behavior model corresponds to a Ragone diagram giving the total energy which can be supplied by the energy storage source, according to the capacity delivered per unit of mass of the energy storage source.

3. The method as claimed in claim 2, wherein said determining couples of energy storage sources which are capable of generating the mission profile with minimum mass comprises: for each possible couple of energy storage sources for hybridization, determining working points on the Ragone diagram for energy storage sources which are capable of generating the mission profile and minimizing the total mass of the two energy storage sources.

4. The method as claimed in claim 3, further comprising comparing the mass of the couple thus determined with the mass of an energy source in an existing architecture.

5. The method as claimed in claim 3, further comprising:
defining suitable power converters for hybridization;
determining couples of energy storage sources which are capable of generating the mission profile with minimum mass, as a function of available power converters; and
determining power converters as a function of the couple thus determined.

6. The method as claimed in claim 3, further comprising further comprising reading-out the energy storage sources in the couple thus determined, and the capacity utilization profiles of the energy storage sources in the couple thus determined.

7. The method as claimed in claim 2, further comprising comparing the mass of the couple thus determined with the mass of an energy source in an existing architecture.

8. The method as claimed in claim 2, further comprising:
defining suitable power converters for hybridization;
determining couples of energy storage sources which are capable of generating the mission profile with minimum mass, as a function of available power converters; and
determining power converters as a function of the couple thus determined.

9. The method as claimed in claim 2, further comprising further comprising reading-out the energy storage sources in the couple thus determined, and the capacity utilization profiles of the energy storage sources in the couple thus determined.

10. The method as claimed in claim 1, further comprising comparing the mass of the couple thus determined with the mass of an energy source in an existing architecture.

11. The method as claimed in claim 10, further comprising the following steps:
defining suitable power converters for hybridization;
determining couples of energy storage sources which are capable of generating the mission profile with minimum mass, as a function of available power converters; and
determining power converters as a function of the couple thus determined.

12. The method as claimed in claim 1, further comprising:
defining suitable power converters for hybridization;
determining couples of energy storage sources which are capable of generating the mission profile with minimum mass, as a function of available power converters; and
determining power converters as a function of the couple thus determined.

13. The method as claimed in claim 12, further comprising further comprising reading-out the energy storage sources in the couple thus determined, and the capacity utilization profiles of the energy storage sources in the couple thus determined.

14. The method as claimed in claim 1, further comprising reading-out the energy storage sources in the couple thus determined, and the capacity utilization profiles of the energy storage sources in the couple thus determined.

* * * * *